(12) United States Patent
LaBerge

(10) Patent No.: US 7,818,601 B2
(45) Date of Patent: *Oct. 19, 2010

(54) METHOD AND APPARATUS FOR DATA TRANSFER

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 316 days.

This patent is subject to a terminal disclaimer.

(21) Appl. No.: 12/041,755

(22) Filed: Mar. 4, 2008

(65) Prior Publication Data

US 2008/0155141 A1    Jun. 26, 2008

Related U.S. Application Data

(63) Continuation of application No. 11/275,809, filed on Jan. 30, 2006, now Pat. No. 7,356,723, which is a continuation of application No. 10/073,611, filed on Feb. 11, 2002, now Pat. No. 7,076,678.

(51) Int. Cl.
    *G06F 1/04* (2006.01)
(52) U.S. Cl. .................................. 713/401; 713/503
(58) Field of Classification Search ............... 713/400, 713/401, 503, 600
    See application file for complete search history.

(56) References Cited

U.S. PATENT DOCUMENTS

| | | | |
|---|---|---|---|
| 5,467,464 A | 11/1995 | Oprescu | |
| 5,621,774 A | 4/1997 | Ishibashi | |
| 5,793,687 A | 8/1998 | Deans | |
| 5,926,838 A | 7/1999 | Jeddeloh | |
| 5,948,083 A | 9/1999 | Gervasi | |
| 6,069,506 A | 5/2000 | Miller, Jr. | |
| 6,112,284 A | 8/2000 | Hayek | |
| 6,166,942 A | 12/2000 | Vo | |
| 6,190,950 B1 | 2/2001 | Noble | |
| 6,192,482 B1 | 2/2001 | Casper | |
| 6,215,145 B1 | 4/2001 | Noble | |
| 6,225,165 B1 | 5/2001 | Noble, Jr. | |
| 6,240,003 B1 | 5/2001 | McElroy | |
| 6,262,611 B1 | 7/2001 | Takeuchi | |
| 6,269,031 B1 | 7/2001 | Fukuhara | |
| 6,408,265 B1 | 6/2002 | Schultz | |
| 6,654,897 B1 | 11/2003 | Dreps | |
| 6,715,096 B2 | 3/2004 | Kuge | |
| 6,889,334 B1 | 5/2005 | Magro | |

(Continued)

FOREIGN PATENT DOCUMENTS

EP    0511408    11/1992

(Continued)

*Primary Examiner*—Dennis M Butler
(74) *Attorney, Agent, or Firm*—Fletcher Yoder P.C.

(57) ABSTRACT

A memory system and method according to various aspects of the present invention comprises a memory and an adaptive timing system for controlling access to the memory. The adaptive timing system captures data in a data valid window (DVW) in a data signal. In one embodiment, the adaptive timing system comprises a delay circuit for sampling the data signal at a midpoint of the DVW. The adaptive timing system may also comprise an identifying circuit for identifying whether the midpoint of the DVW corresponds to an actual midpoint of the DVW and adjusting the delay circuit accordingly.

21 Claims, 4 Drawing Sheets

U.S. PATENT DOCUMENTS

| | | |
|---|---|---|
| 7,076,678 B2 | 7/2006 | LaBerge |
| 7,165,185 B2 | 1/2007 | Li |
| 7,356,723 B2 * | 4/2008 | LaBerge ..................... 713/401 |
| 2003/0120989 A1 | 6/2003 | Zumkehr |

FOREIGN PATENT DOCUMENTS

| | | |
|---|---|---|
| EP | 0735491 | 10/1996 |
| JP | 07281992 | 10/1995 |

* cited by examiner

METHOD AND APPARATUS FOR DATA TRANSFER

REFERENCE TO RELATED APPLICATIONS

This Application is a continuation of and claims priority to U.S. application Ser. No. 11/275,809 filed Jan. 30, 2006, which is a continuation of U.S. application Ser. No. 10/073,611 filed Feb. 11, 2002, now U.S. Pat. No. 7,076,678, issued Jul. 11, 2006.

FIELD OF THE INVENTION

The invention relates generally to memory devices, methods, and systems, and more particularly, to timing for memory accesses.

BACKGROUND OF THE INVENTION

Many electronic systems and virtually every computer include a memory to store information. For temporary storage, many systems use random access memory (RAM) for high access speed and low cost. Several types of RAM and other memory devices have been and continue to be developed as computers and other electronic systems evolve.

To store and retrieve information using a memory, data is asserted on multiple data lines by a data source device. In a purely synchronous system, data output and capture are referenced to a common free-running system clock. The maximum data rate for such as system, however, is reached when the sum of output access time and flight time approaches the bit time (the reciprocal of the data rate). Although generating delayed clocks for early data launch and/or late data capture allows for increased data rates, such techniques do not account for movement of the data valid window (DVW, or data eye) relative to any fixed clock signal, for example due to changes in temperature, voltage, or loading.

Many memories, such as various double data rate synchronous dynamic RAM (DDR SDRAM), operate in conjunction with a data strobe to perform the memory access when data on the data lines is most likely to be valid. Data strobes are non-free-running signals driven by the device that is driving the data signals (the memory controller for WRITE operations, the memory for READ operations). For READ operations, the data strobe signals are edge-aligned with the data signals such that all data and the data strobes are to be asserted by the memory using the same internal clock signal. Consequently, the data signals and the data strobe signals are generated at nominally the same time.

A typical memory, however, does not generate data strobes in the middle of the DVW. Consequently, an external system reading the memory typically delays reading the data lines until valid data is present on the data lines. The memory controller is typically configured to delay the received strobe to the center of the DVW. Many memory systems synchronize memory accesses using delay locked loop (DLL) circuits to generate an appropriate delay following the data strobe. DLL circuits, however, consume considerable area in an already crowded integrated circuit. Using strobes and DLL circuits also presents difficulties in testing components for quality control. Further, many systems use memory controllers that control several different and independent memory modules.

In addition, to insert appropriate delays for each of the memory modules, memory controllers often include slave DLL circuits dedicated to each memory module and a master DLL circuit for controlling operation of the slave DLL circuits. Each additional DLL circuit requires additional area in the integrated circuit, thus tending to increase the size, cost, power consumption, and complexity of the memory system. The problems are exacerbated by the addition of multiple master DLL circuits, each associated with one or more bytes on a bus.

SUMMARY OF THE INVENTION

A memory system and method according to various aspects of the present invention includes a memory and an adaptive timing system for controlling access to the memory. The adaptive timing system captures data in a data valid window (DVW) in a data signal. In one embodiment, the adaptive timing system includes a delay circuit for sampling the data signal at a midpoint of the DVW. The adaptive timing system may also include an identifying circuit for identifying whether the midpoint of the DVW corresponds to an actual midpoint of the DVW and adjusting the delay circuit accordingly.

BRIEF DESCRIPTION OF THE DRAWINGS

The present invention is illustrated by way of example and not limitation in the accompanying figures, in which like references indicate similar elements, and in which.

Elements and connections in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The subject matter of the present invention is particularly suited for use in connection with electronic systems using memory components, such as SDRAMs. As a result, the preferred exemplary embodiment of the present invention is described in that context. It should be recognized, however, that such description is not a limitation on the use or applicability of the present invention, but is instead provided to enable a full and complete description of an exemplary embodiment.

Figure 1:
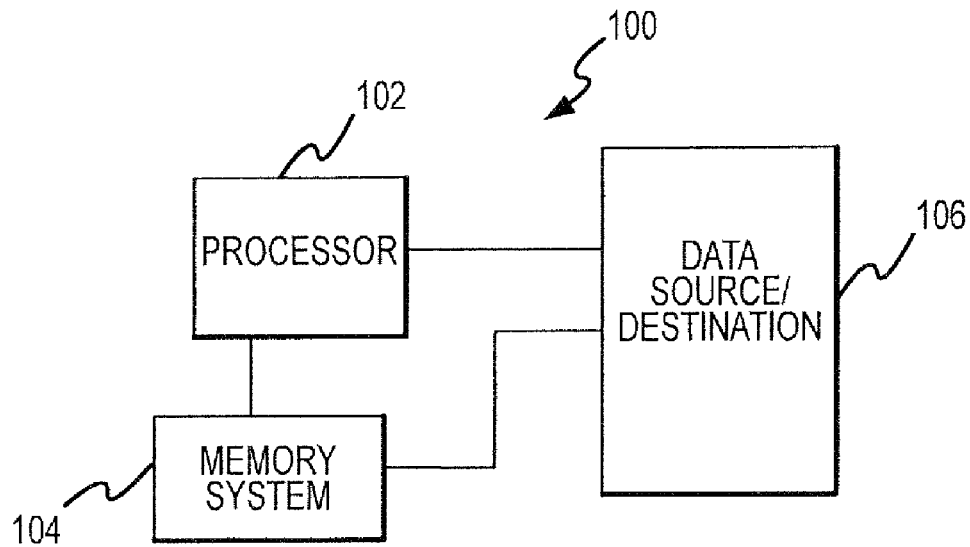
FIG. 1 is a block diagram of an electronic system according to various aspects of the present invention.

Referring to FIG. 1, an electronic system 100 according to various aspects of the present invention may include a processor 102, a memory system 104, and a data source and/or destination 106. The electronic system 100 comprises a system using a memory, such as a conventional personal computer system. The electronic system 100 may comprise, however, any suitable electronic system, such as a communication system, computing system, entertainment system, control system, portable electronic device, audio component, or factory control system, and the various components may differ according to the particular system and environment. The processor 102 generally controls operation of the electronic system, and may comprise any appropriate processor or controller, such as an Intel, Texas Instruments, or Advanced Micro Devices microprocessor. The data sources and/or destinations 106 may comprise any suitable components in the electronic system 100 for sending and/or receiving data, including conventional peripherals such as a hard drive, optical storage system, tape storage system, printer, display, keyboard, tracking device, or the like. The data source/destination 106 is an illustrative component that may be primarily a data source (such as a keyboard or sensor), a data destination (such as a display or speaker), or both (such as a hard drive or transceiver).

Figure 2:
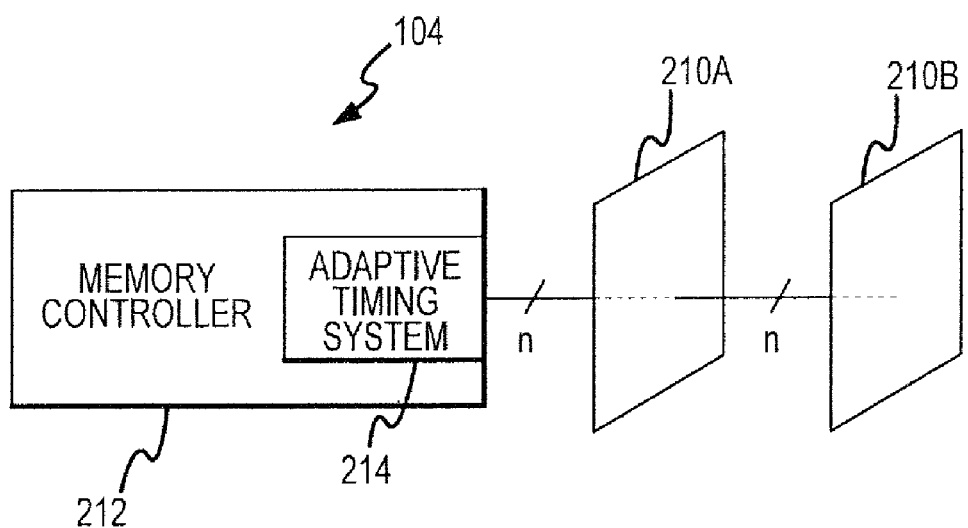
FIG. 2 is a block diagram of a memory system.

The memory system 104 comprises a storage system for storing data. The memory system 104 may comprise any appropriate memory system for storing data and transferring data between the memory system 104 and the data source/destination 106 or processor 102. Referring to FIG. 2, in the present embodiment, the memory system 104 includes one or more memory modules 210A, B and a memory controller 212. The memory modules 210 may comprise any system for storing data, such as a conventional ROM, SRAM, DRAM, SDRAM, or any other suitable storage system. In the present embodiment, the memory modules 210 comprise DDR SDRAMs from Micron, such as Micron MT46V64M4 256 Mb DDR SDRAMs.

Figure 3:
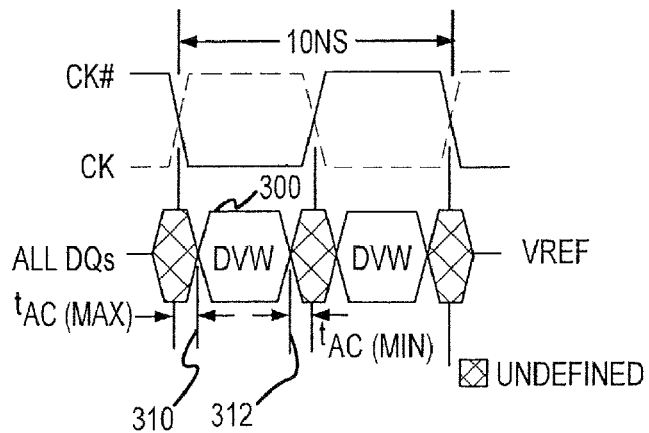
FIG. 3 represents signal waveforms for a clock signal, a complementary clock signal, and a plurality of data signals.

The memory controller 212 controls access to, including data transfers to and from, the memory module 210, and may perform further functions and operations as well. Data may be exchanged between the memory system 104 and the data source/destination 106 along a set of n data lines according to any appropriate method or technique. In the present embodiment, a conventional data transfer process transfers data by capturing data in a data valid window (DVW) of a data signal. For example, referring to FIG. 3, in a source synchronous system according to the present embodiment, data is suitably asserted on the data lines upon the crossing of a clock signal (CK) and a complementary clock signal (CK#). A first period of time ($t_{AC(MAX)}$) passes before all of the data bits (DQs) are valid, which defines a leading edge 310 of the DVW 300. The data bits remain valid during the DVW 300 until a second period of time ($t_{AC(MIN)}$) before the next clock signal crossing, which defines the trailing edge 312 of the DVW 300. The duration of the DVW 300 may change, for example due to load, temperature, and/or voltage variations. Similarly, the positions of the trailing and leading edges 310, 312 of the DVW 300 may change relative to the clock signals.

The memory controller 212, among other things, controls the timing of access operations to the memory modules 210, such as to enhance the capture of accurate data. To optimize data capture, the memory controller 212 of the present embodiment captures data at the approximate midpoint of the DVW 300, The memory controller 212 further suitably identifies changes in the duration and relative position of the DVW 300.

Referring again to FIGS. 2 and 3, in the present embodiment, the memory controller 212 includes an adaptive timing system 214 for controlling access to the memory modules 210. Generally, the adaptive timing system 214 controls the time at which the data is latched for transfer to or from the memory modules 210. The timing is suitably controlled to latch data at a time when the asserted data is most likely to be valid. Accordingly, the adaptive timing system 214 identifies the location of the DVW 300 in the data signal. In addition, the adaptive timing system 214 may track changes in the DVW 300.

The DVW 300 and changes in its characteristics may be identified in any suitable manner. For example, the adaptive timing system 214 suitably identifies and tracks changes in the leading and trailing edges 310, 312 of the DVW 300. By identifying the leading and trailing edges 310, 312 of the DVW 300 and changes in positions of the respective edges 310, 312, the midpoint of the DVW 300 may be approximated and the optimal access time may be adjusted. Further, by oversampling and tracking multiple points in a timing signal, other characteristics, such as the rate at which the midpoint and the respective edges 310, 312 change, may be tracked as well.

In addition, the memory controller 212 may use different operating characteristics for different memory modules 210. For example, a first module 210A near a heat source may heat up and change its DVW 300 faster than another memory module 210B. The memory controller 212 suitably uses different DVW 300 characteristics for each module 210A, B, such as different midpoints and DVW edges 310, 312. Further, the memory controller 212 may include multiple adaptive timing systems 214. For example, multiple adaptive timing systems 214 are suitably dedicated to each bit, nibble, byte, or other set of data presented on the data lines.

To identify the leading and trailing edges 310, 312 of the DVW 300, the adaptive timing system 214 of one embodiment compares signal values at nominal leading and trailing edges 310, 312 of the DVW 300 to a signal value at a nominal midpoint. If the adaptive timing system 214 samples a toggling signal at the approximate actual midpoint of the DVW 300, then the samples at the nominal leading and trailing edges 310, 312 of the DVW 300 tend to be substantially identical to the sample at the approximate actual midpoint of the DVW 300. Samples beyond the leading and trailing edges 310, 312, however, tend to differ from the samples within the DVW 300.

Figure 4:
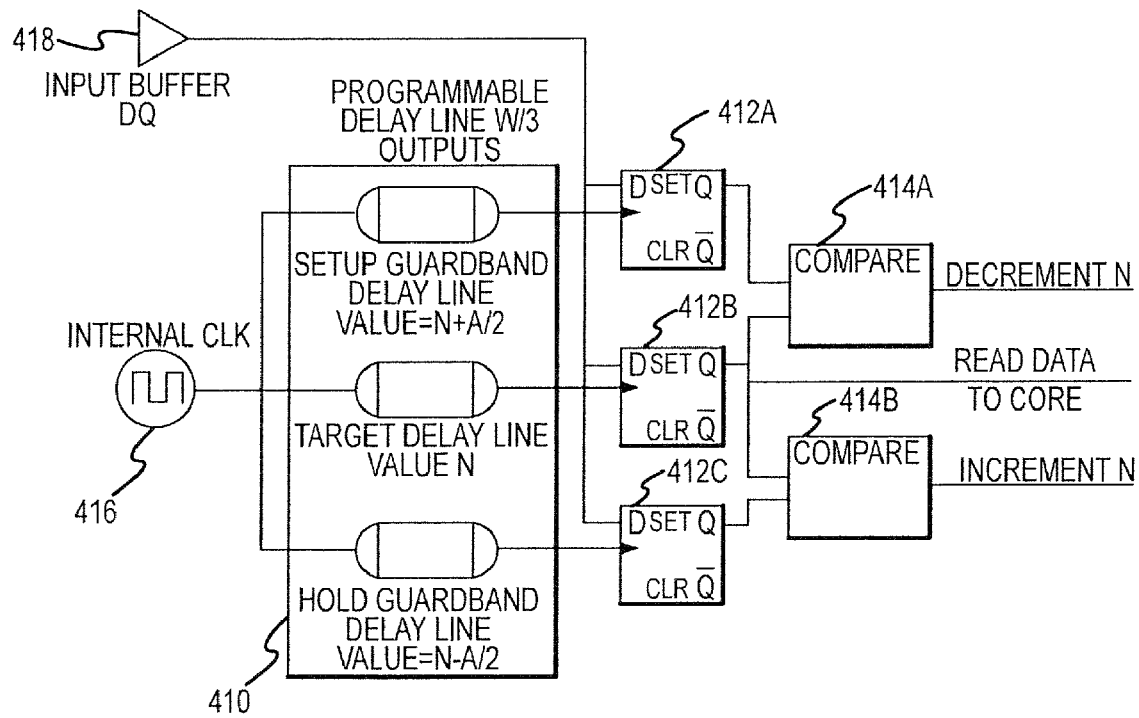
FIG. 4 is a block diagram of an adaptive timing system.

Referring to FIG. 4, in the present embodiment, the adaptive timing system 214 includes a delay circuit 410, a plurality of latch circuits 412, and at least one compare circuit 414. Generally, the delay circuit 410 asserts multiple delay clock signals at different times with respect to a timing signal and/or data signal. The latch circuit 412 receives the timing signal and/or data signal from the data source 106 and delay clock signals from the delay circuit 410 to latch data at the time of the delay clock signal, and provides the latched signal to the compare circuit 414 and the data destination 106. The compare circuit 414 receives latched signals from the latch circuits 412 sampled at different times, compares the latched signals to identify differences among them, and may adjust the timing of the delay clock signals generated by the delay circuit 410 accordingly.

In particular, the delay circuit 410 of the present embodiment asserts multiple signals at different times. The delay circuit 410 may comprise any appropriate system for generating signals at different times, such as a programmable multi-tap delay line. The delays programmed into the taps may correspond to any appropriate intervals and any appropriate DVW 300 size. For example, the delay circuit 410 may comprise a three-tap delay line having a center tap corresponding to the nominal approximate midpoint of the DVW 300. The other two taps suitably correspond to a setup guardband and a hold guardband, respectively, on either side of the DVW 300 nominal midpoint. The delay circuit 410 also receives an internal clock signal 416, for example a general free-running memory controller 212 clock signal, that suitably operates at a higher frequency than the data signal to facilitate multiple sampling of the timing and/or data signal in the DVW 300.

The guardband intervals are suitably separated from the DVW 300 nominal midpoint by any duration selected to identify variation in the DVW 300 characteristics and correspond a desired DVW 300 duration. In the present embodiment, the guardbands are set approximately, or slightly less than, half the expected duration of the DVW 300 from the nominal midpoint. Consequently, the first tap corresponds to a delay immediately after the leading edge 310 of the DVW 300 (the nominal leading edge), and the third tap similarly corresponds to a delay immediately before the trailing edge 312 of the DVW 300 (the nominal trailing edge). The delay associated with each tap may be adjustably programmed, such as to correspond to an adjusted midpoint of the DVW 300 as it moves, for example due to temperature and/or voltage variations.

The latch circuit 412 receives data from the data source 106 and latches input data at its output upon receipt of a delay clock signal from the delay circuit 410. The latch circuit 412 may comprise any suitable system for asserting and holding data upon receipt of a delay clock signal. In the present embodiment, each output of the delay circuit 410 is connected to a corresponding latch circuit 412. Each latch circuit 412 comprises a circuit for latching an input value at an output upon assertion of a latch signal. Each latch circuit 412 may comprise a circuit having a data input, a clock input for the latch signal, and an output, such as a flip-flop. The data input is connected to the data source 106, for example via a buffer 418. In the present embodiment, the data source 106 is the memory module 210. The clock input is connected to the corresponding tap outputs of the delay circuit 410, and the latch circuit output is connected to the compare circuit 414. The output of the center latch circuit is also connected to the data destination 106. When the various taps of the delay circuit 410 assert their respective delay clock signals, each latch circuit 412 is activated to capture the input data received by the latch circuit 412 when the delay clock signal is asserted. Thus, each latch circuit 412 captures data received from the data source 106 at different times, such as the midpoint and the leading and trailing edges 310, 312 of the timing and/or data signal.

The compare circuit 414 receives latched data from at least two of the latch circuits 412 and compares the data to generate an output signal. The compare circuit 414 may comprise any system for determining whether signals are substantially identical or different. In the present embodiment, the compare circuit 414 comprises a conventional compare circuit receiving input signals from the center latch circuit 412B and one of the other latch circuits 412A, C. The compare circuit 414 compares the signals and determines whether a difference between the signals exceeds a selected threshold. If so, the compare circuit 414 generates a first comparison signal (such as a logic HIGH signal); if not, the compare circuit 414 generates a second comparison signal (such as a logic LOW signal).

The memory system 104 is suitably configured to respond to the signals from the compare circuit 414 in any appropriate manner, such as to determine whether and how much to adjust the delays associated with one or more of the delay circuit 410 taps. By responding to the compare circuit 414 signals, the delay circuit 410 may adjust the delays associated with the delay circuit 410 taps to a desired position relative to the data signal. When a compare circuit 414 indicates that the signals received from the latch circuits 412 are substantially identical, then the signal near the nominal edge (leading edge 310 or trailing edge 312) matches the signal at the nominal midpoint. Therefore, the signal at the nominal edge is within the DVW 300. If the signals do not substantially match, then the signal associated with the nominal edge is outside the DVW 300, thus indicating a change in the DVW 300. Accordingly, the delays for the various delay circuit 410 taps may be adjusted to shift the center tap to the approximate midpoint of the DVW 300.

In the present embodiment, the memory controller 212 adjusts the delays associated with the three delay taps in accordance any appropriate method or algorithm. For example, when the compare circuit 414 indicates that the DVW 300 has moved, the delay associated with each tap may be changed to shift the delays associated with the various taps to move the nominal approximate midpoint closer to the actual midpoint of the DVW 300. The delays associated with the outer taps may be similarly adjusted to place the nominal approximate edges associated with the outer taps closer to the actual leading and trailing edges 310, 312 of the DVW 300. For example, one or more cycles or half-cycles of the memory controller 212 clock may be added to or subtracted from the current delay values of the various taps.

The adjustments to the delay circuit may be made in any appropriate manner. For example, the particular technique for adjusting the delays may be selecting to decrease the effects of noise or other short term effects on the system. In one embodiment, the memory controller may require two or more consecutive indications from the compare circuit 414 that the DVW 300 has moved. Further, the memory controller may have adjustment limits so that the delays associated with the taps may be adjusted a limited number of times during a particular time interval or up to a limited magnitude of adjustment. The type and value of such limits may be selected according to any criteria for a particular system or application.

Figure 5:
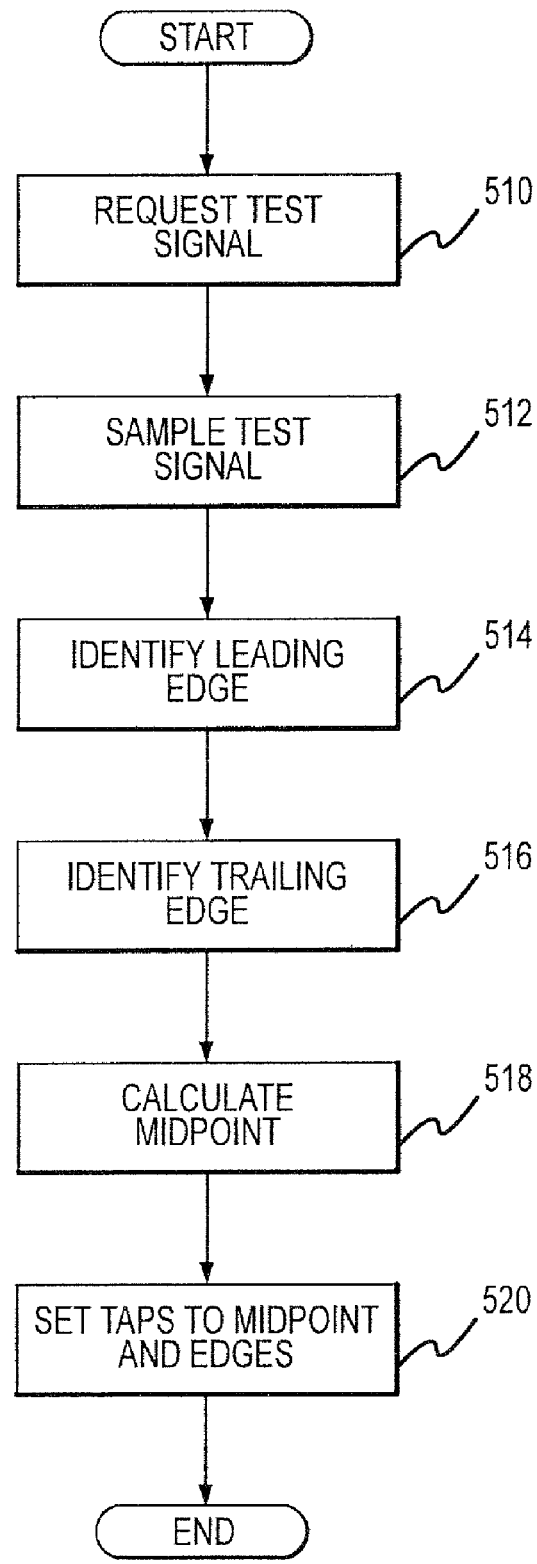
FIG. 5 is a flow diagram of a calibration process.

The memory system 104 may initially calibrate the adaptive timing system 214. Calibration provides initial values for the nominal midpoint and leading and trailing edges 310, 312. The initial values may be provided in any appropriate manner, such as by using preselected default values or testing for DVW 300 information. For example, referring to FIG. 5, for a calibration process of the present embodiment, the memory controller 212 initially requests a known timing signal from the relevant memory module 210 (step 510). The timing signal may be any suitable signal, such as a predetermined timing signal, a conventional strobe signal, a WRITE and READ operation to generate a known signal, or the data signal itself. In one embodiment, the timing signal is a toggling signal alternating between binary high and low signals.

When the timing signal is asserted, the memory controller 212 samples the timing signal at several points in the timing signal (step 512), for example using the adaptive timing circuit. In the present embodiment, the memory controller suitably samples the timing signal over several points within one or more cycles of the timing signal to conduct a sweep of the timing signal. The samples may then be analyzed to identify the approximate leading and trailing edges 310, 312 of the signal's DVW 300 (steps 514, 516) and calculate the approximate midpoint relative to the free-running clock (step 518). For example, the memory controller 212 may identify a first and a last sample following a data strobe that achieve a threshold value known to be in the timing signal. The delay circuit 410 is then suitably programmed to place the center tap delay at the approximate midpoint of the DVW 300 and the outer taps near the approximate leading and trailing edges 310, 312 (step 520). The memory system 104 may then proceed with normal operation, using the center tap as the latch circuit signal to capture data. The calibration process may be repeated at any time, such as at periodic intervals.

After the memory system 104 has been calibrated, the system may be adjusted at any desired time. While the memory system 104 operates, the adaptive timing system 214 may check the DVW 300 to determine whether the midpoint of the DVW 300 has drifted. The adaptive timing system 214 may check the DVW 300 at any time, for example continuously, at periodic intervals, or upon expiration of a timer. Further, the adaptive timing system 214 may adjust the nominal midpoint and leading and trailing edges 310, 312 in the event of drift. If the memory controller 212 operates with multiple memory modules 210 or sections, the adaptive timing system 214 may perform an adjustment process for each memory module 210A, B or section of memory.

For example, as the memory module 210 heats up, the DVW 300 may move. The memory system 104 may be configured to occasionally check the DVW 300, such as in accordance with a thermal and/or voltage time constant of the system. For example, the memory controller 212 may provide a CALIBRATE command to the memory to request the timing signal at regular intervals no longer than the thermal and/or voltage time constant. In another embodiment, the memory controller 212 may include a time constant timer to trigger the adjustment process. If the memory controller 212 reads a toggling pattern (such as using the data signal) in normal operation sufficient to verify the characteristics of the DVW 300, the time constant timer may be reset. If the time constant timer expires, the adjustment process may then be initiated. Thus, the adaptive timing system 214 may continuously sample the strobes on READ operations and update the delay circuit 410 opportunistically when no READ operations are occurring. Consequently, the full adjustment process is performed only when a sufficient pattern has not been received and the time constant timer has expired.

Figure 6:
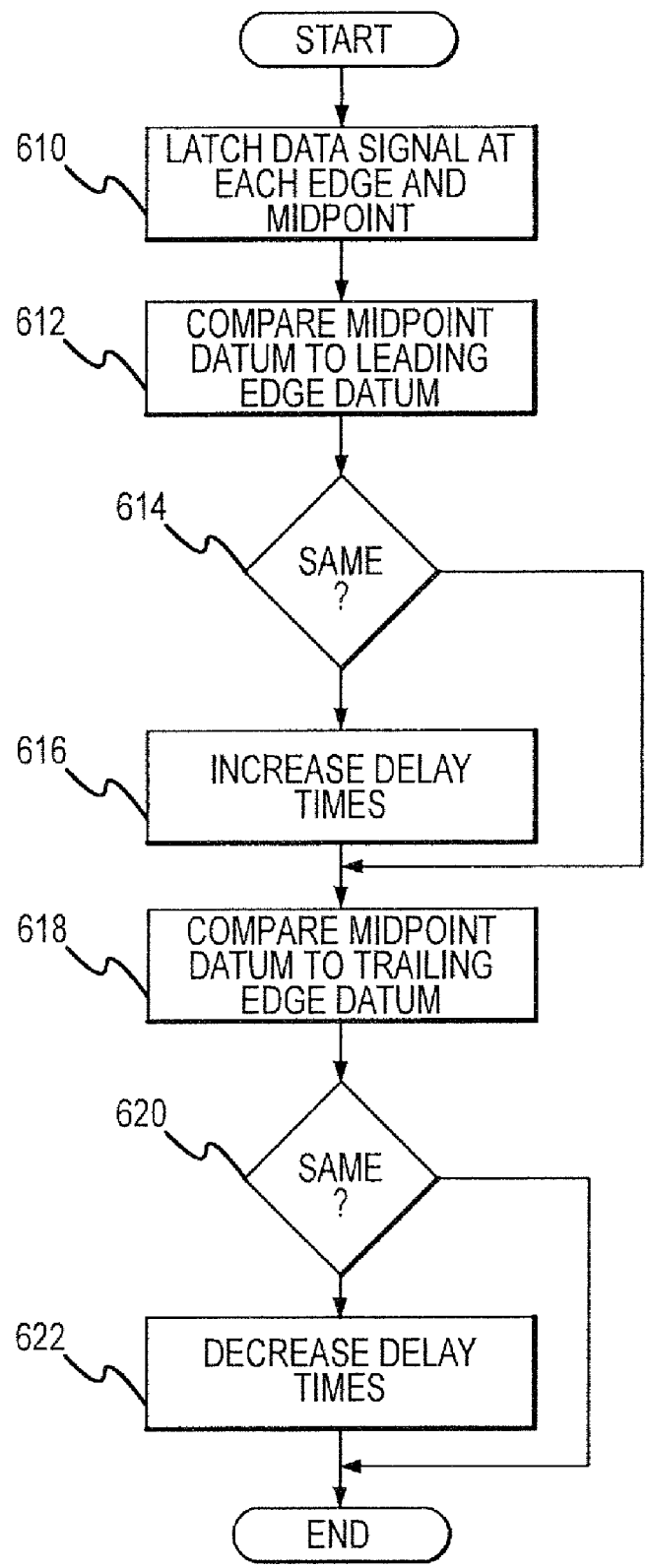
FIG. 6 is a flow diagram of a timing adjustment process.

Referring to FIG. 6, the memory controller 212 of the present embodiment performs a timing adjustment process by receiving the timing signal, which may be any appropriate signal for identifying shifts in the DVW 300, such as a predetermined signal generated by the memory module 210, the conventional strobe signal, or the data signal itself. When the timing signal is received, the delay circuit 410 taps generate signals that cause the latch circuits 412 to capture the signal at various times (step 610), such as at the nominal leading and trailing edges 310, 312 and midpoint. The output signals from the latch circuits 412 are provided to the compare circuits 414 that compare the various signals to determine whether the leading and/or trailing edges 310, 312 of the data signal have shifted. For example, the compare circuit 414A may compare the leading edge 310 data to the midpoint (step 612). If the data are the same (step 614), then the nominal leading edge 310 is still within the DVW 300, and no adjustment is necessary. If the data are not the same, then the DVW 300 has moved. Accordingly, the nominal leading and trailing edges 310, 312 and midpoint may be increased a selected amount (step 616) or according to any selected criteria or algorithm.

Similarly, the compare circuit 414B may compare the trailing edge 312 data to the midpoint data (step 618). If the data are the same (step 620), then the nominal trailing edge 312 is still within the DVW 300, and no adjustment is necessary. If the data are not the same, then the DVW 300 has moved. Accordingly, the nominal leading and trailing edges 310, 312 and midpoint may be decreased a selected amount (step 622) or according to any selected criteria or algorithm. Thus, the delay circuit 410 is suitably programmed to shift the various delays associated with the taps so that the center tap is repositioned to an adjusted midpoint and adjusted leading and trailing edges 310, 312.

The present embodiment is described in conjunction with a delay circuit 410 having three taps, one for the nominal midpoint and two for the nominal leading and trailing edges 310, 312 of the DVW 300. Additional taps may be provided, however, to collect data about other portions of the data signal. For example, additional taps may assigned to intervals between the midpoint and the edges 310, 312 of the DVW 300 and may be similarly connected to compare circuits 414. The data collected by latch circuits 412 connected to the additional taps may be used to identify changes in the DVW 300 as well as the rate at which the changes in the DVW 300 are occurring.

Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential features or elements of any or all the claims. The terms "comprises," "comprising," or any other variation, are intended to cover a non-exclusive inclusion, such that a process, method, article, or apparatus that comprises a list of elements does not include only those elements, but may include other elements not expressly listed or inherent to such process, method, article, or apparatus.

In the foregoing specification, the invention has been described with reference to specific embodiments. However, various modifications and changes can be made without departing from the scope of the present invention as set forth in the claims. Accordingly, the specification and figures are to be regarded in an illustrative rather than a restrictive sense, and all such modifications are intended to be included within the scope of present invention as claimed.

The invention claimed is:

1. A method of transferring data, comprising:
   sampling a timing signal from a data source substantially at a nominal leading edge of a data valid window, substantially at a nominal trailing edge of the data valid window, or both;
   identifying the data valid window in a data signal based at least in part upon the sampled timing signal, wherein identifying the data valid window further comprises:
   sampling generally at a nominal midpoint of the data valid window in the timing signal, and comparing the nominal midpoint sample to at least one of the nominal leading edge sample or the nominal trailing edge sample; and
   adjusting at least one of the nominal leading edge or the nominal trailing edge of the data valid window based at least in part upon the comparison of the nominal midpoint sample to the nominal leading edge sample or to the nominal trailing edge sample; and
   generating a data capture signal at a point within the data valid window based at least in part upon the adjusting of at least one of the nominal leading edge or the nominal trailing edge of the data valid window.

2. The method of claim 1, further comprising capturing data in the identified data valid window.

3. The method of claim 1, wherein sampling a timing signal further comprises sampling generally shortly after the nominal leading edge, and generally shortly before the nominal trailing edge of the data valid window in the timing signal.

4. The method of claim 1, wherein identifying the data valid window further comprises adjusting both the nominal leading edge and the nominal trailing edge based at least in part upon the comparison of the nominal midpoint sample to the nominal leading edge sample and to the nominal trailing edge sample.

5. The method of claim 1, further comprising adjusting the sampling of the timing signal based at least in part upon the identified data valid window in the data signal.

6. The method of claim 1, further comprising receiving a data signal from a memory.

7. The method of claim 6, further comprising capturing a datum from the data signal at an approximate midpoint of the data valid window of the data signal based at least in part upon the nominal midpoint of the data valid window of the timing signal.

8. The method of claim 7, further comprising transferring the captured data to a data destination.

9. The method of claim 8, further comprising saving the transferred data.

10. The method of claim 1, wherein generating a data capture signal comprises generating a data capture signal at an approximate midpoint of the data valid window.

11. A system for transferring data, comprising:
a sampling circuit capable of sampling a signal to identify at least one of an approximate leading edge or an approximate trailing edge of a data valid window; and
an adjusting circuit capable of adjusting at least one of a nominal leading edge or a nominal trailing edge of the data valid window based at least in part upon at least one of the identified approximate leading edge of the data valid window or the identified approximate trailing edge of the data valid window.

12. The system for transferring data of claim 11, wherein the sampling circuit generates a data capture signal at an approximate midpoint of the data valid window.

13. The system for transferring data of claim 12, further comprising a capturing circuit capable of capturing data generally at an approximate midpoint of the data valid window.

14. The system of transferring data of claim 13, further comprising a comparing circuit capable of comparing a sample from the approximate midpoint of the data valid window to at least one of a sample from the nominal leading edge or a sample from the nominal trailing edge of the data valid window.

15. The system of claim 11, wherein the sampling circuit is further capable of sampling a timing signal generally shortly after the nominal leading edge, and generally shortly before the nominal trailing edge of the data valid window in the timing signal.

16. A memory controller for controlling transfers of data from a data source to a data destination, comprising:
adaptive timing circuitry configured to generate a plurality of capture signals; to identify a leading edge and a trailing edge of a data valid window of a data signal; to establish a nominal leading edge and a nominal trailing edge within the data valid window that approximate the identified leading and trailing edges, respectively; to identify a change in the data valid window at least in part by generating a first capture signal at the nominal leading edge of the data valid window, a second capture signal at the nominal trailing edge of the data valid window, and a third capture signal at a nominal midpoint of the data valid window; and to adjust at least one of the nominal leading edge or the nominal trailing edge based at least in part upon the identified change in the data valid window.

17. The memory controller of claim 16, wherein the change in the data valid window comprises at least one of a change in the duration of the data valid window or a change in the relative position of the data valid window.

18. The memory controller of claim 16, wherein the adaptive timing circuitry is configured to adjust timing of the generated capture signals based at least in part upon the adjustment of at least one of the nominal leading edge or the nominal trailing edge of the data valid window.

19. The memory controller of claim 18, wherein the adaptive timing circuitry is configured to calculate an optimal data access time based at least in part upon the adjustment of at least one of the nominal leading edge or the nominal trailing edge.

20. The memory controller of claim 19, wherein the optimal data access time is a nominal midpoint of the data valid window calculated from the nominal leading edge and the nominal trailing edge of the data valid window following the adjustment of at least one of the nominal leading or trailing edges.

21. The memory controller of claim 16, wherein the adaptive timing circuitry is configured to track a rate at which the data valid window changes over time.

* * * * *